United States Patent [19]

Tillett, Jr. et al.

[11] Patent Number: 4,633,029

[45] Date of Patent: Dec. 30, 1986

[54] APPARATUS AND METHOD FOR USE IN THERMOELECTRIC POWER GENERATION

[75] Inventors: George C. Tillett, Jr.; Gary V. Holland, both of Bartlesville, Okla.

[73] Assignee: Phillips Petroleum Company, Bartlesville, Okla.

[21] Appl. No.: 699,287

[22] Filed: Feb. 7, 1985

[51] Int. Cl.$^4$ .................................................. H01L 35/00
[52] U.S. Cl. ....................................... 136/205; 431/350
[58] Field of Search .................................. 136/205–212; 431/350–352, 268

[56] References Cited

U.S. PATENT DOCUMENTS

| | | | |
|---|---|---|---|
| 3,561,903 | 2/1971 | Rubinstein | 431/350 |
| 3,627,588 | 12/1971 | Rubinstein et al. | 136/205 |
| 3,881,962 | 5/1975 | Rubinstein | 136/209 |
| 3,957,541 | 5/1976 | Bustard et al. | 136/205 |
| 3,989,546 | 11/1976 | Purdy et al. | 136/205 |
| 3,989,547 | 11/1976 | Purdy et al. | 136/205 |
| 4,095,998 | 6/1978 | Hanson | 136/208 |

OTHER PUBLICATIONS

Teledyne Energy Systems Maintenance Manual, Kirk Othmer Encyclopedia.

Primary Examiner—John F. Terapane
Assistant Examiner—T. J. Wallen
Attorney, Agent, or Firm—William R. Sharp

[57] ABSTRACT

An apparatus and method for generating thermoelectric power utilizes a hollow shell member having a cavity defined therein and a cartridge member disposed within the cavity, wherein the cartridge member has a combustion chamber defined therein. The cartridge member is mounted such that a space exists between the interior surface of the shell member and the exterior surface of the cartridge member. Thermoelectric elements are mounted to the exterior surface of the shell member such that no air spaces exist therebetween. A mixture of a combustible fuel and air is introduced into the chamber, the air/fuel ratio being less than the stoichiometric ratio for methane. Heat generated within the combustion chamber upon combustion of the fuel is transferred via the shell member to the thermoelectric elements which generate electrical energy in response thereto.

18 Claims, 6 Drawing Figures

APPARATUS AND METHOD FOR USE IN THERMOELECTRIC POWER GENERATION

BACKGROUND OF THE INVENTION

This invention relates to an apparatus for use in thermoelectric power generation. In another aspect, the invention relates to a method of thermoelectric power generation.

A thermoelectric generator is essentially a device wherein heat is converted directly to electrical energy. The components of a thermoelectric generator include a heat source and thermoelectric elements for receiving heat from the heat source and converting such heat to electrical energy. A thermoelectric generator also typically includes some external electronic circuitry such as a DC-DC conversion circuit for receiving power from the thermoelectric elements at a low voltage, and delivering current at a higher voltage. Thermoelectric generators are usually operable in all weather conditions, and can be left unattended for long periods of time. Therefore, such generators are particularly suitable for use in remote regions where normal sources of electric power are not available.

Several types of heat souces are used in thermoelectric generators, including sources based on nuclear and solar energy. One of the most common types of thermoelectric generators is the fossil fuel generator, wherein combustion of a fossil fuel such as natural gas takes place.

Heretofore, such fossil fuel generators have had several serious limitations. One such limitation involves ineffective use of sour gas, (gas having high concentrations of hydrogen sulfide) particularly in fossil fuel generators of the type wherein fuel is combusted in the presence of a catalyst. After operation for a period of time on sour gas, elemental sulfur is produced which plates the catalyst, thereby rendering the catalyst ineffective. Another limitation involves the ability to use fuels having different heating values. In prior fossil fuel generators, changing from one fuel with a certain heating value to another fuel with a different heating value requires an adjustment of the air/fuel flow ratio. Such an adjustment can be time consuming and inconvenient.

SUMMARY OF THE INVENTION

It is, therefore, an object of the present invention to provide an apparatus and method for use in thermoelectric power generation.

Another object of the present invention is to provide an apparatus and method for use in thermoelectric power generation wherein fuel gases having high concentrations of hydrogen sulfide can be used effectively.

It is yet another object of the invention to provide a method of generating power thermoelectrically wherein fuels having different heating values can be used conveniently such that no adjustments are required when changing from one fuel to another fuel.

Certain of the above objects are realized in an apparatus which includes a hollow shell member and a hollow cartridge member disposed within the shell member. The cartridge member has an interior surface which defines the chamber, and an exterior surface, a portion of which is in contact with the interior surface of the shell member such that a space exists between the surfaces. At least one thermoelectric element is mounted to the shell member so as to be in direct thermal contact therewith. The thermoelectric element is mounted such that substantially no air spaces exist between the shell member exterior surface and the thermoelectric element.

According to another aspect of the present invention, there is provided a shell member and cartridge member substantially as described above. Heat is generated within the chamber, such heat being provided to at least one thermoelectric element in direct thermal contact with the exterior surface of the shell member.

According to further aspects of the invention, an apparatus and method are provided in which a combustible fuel and air are mixed to form a mixture, the air/fuel ratio being less than the stoichiometric ratio for methane. The mixture is passed into a combustion chamber where the fuel is combusted so as to generate heat. In thermoelectric power generation, this heat may be provided to thermoelectric elements which generate electrical energy.

According to a preferred embodiment described hereinafter, a catalyst is contained in the above described chamber, through which is flowed a mixture of a fuel gas and air. Catalytic oxidation of the fuel gas takes place in the chamber. By mounting the cartridge within the shell as described above, temperatures in the combustion chamber can be maintained at a sufficiently high level to oxidize the sulfur in a fuel having hydrogen sulfide therein. Consequently, production of elemental sulfur, which will plate the catalyst, is avoided. Furthermore, by introducing into the combustion chamber a fuel rich mixture having an air/fuel ratio less than the stoichiometric ratio for methane, fuels of different heating values can be used without adjustments.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, briefly described below.

DESCRIPTION OF THE PREFERRED EMBODIMENTS

Figure 1:
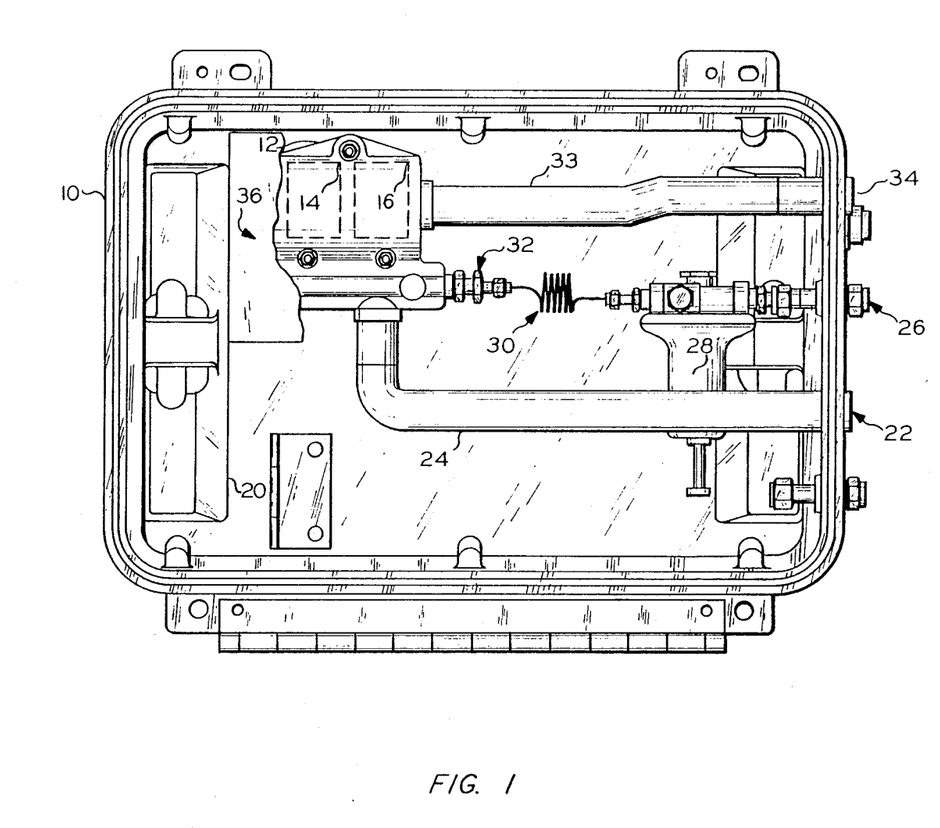
FIG. 1 is a view of a thermoelectric generator designed according to the invention, which includes a burner unit, as it is mounted in a case.
Figure 2:
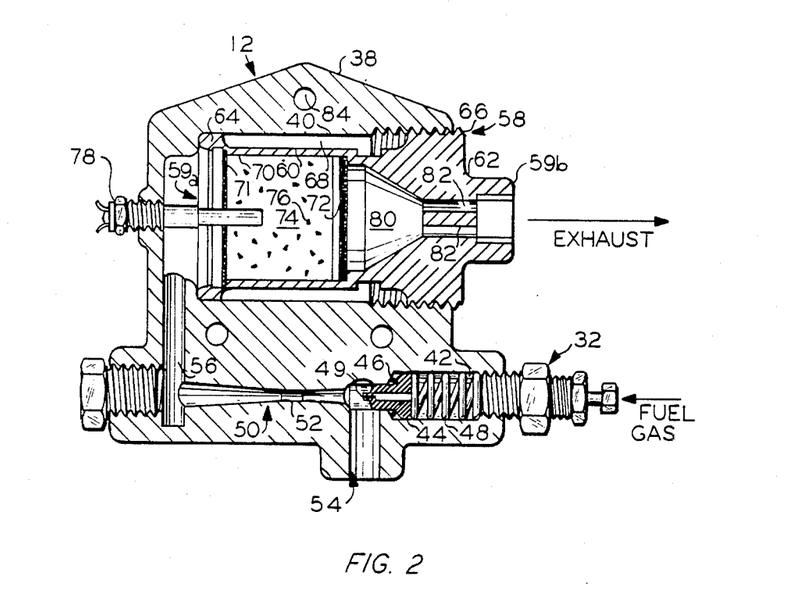
FIG. 2 is a cross sectional view of the burner unit shown in FIG. 1.
Figure 3:
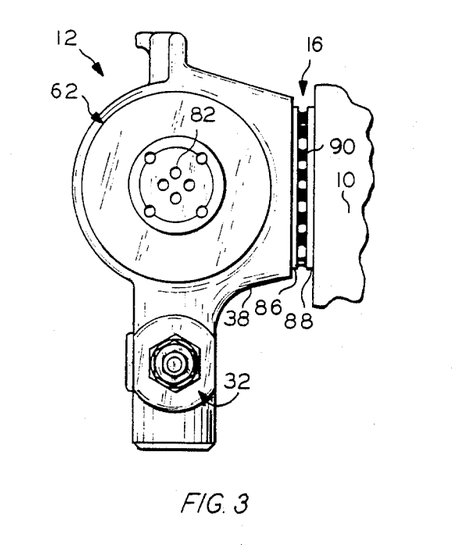
FIG. 3 is an end view of the burner unit which shows thermoelectric elements mounted between the burner unit and the case.

Referring now to FIG. 1, the apparatus shown includes a case section 10 within which are mounted various components of a thermoelectric generator according to the present invention. The thermoelectric generator serves as a power source in a computerized flow measurement unit, the remainder of which is mounted within another case section. The portion of the unit being so powered by the generator forms no part of the present invention and is therefore not shown. A burner unit 12, hereinafter described in detail with reference to FIGS. 2 and 3, is mounted to the wall of case 10 by means of suitable mounting posts. Two thermoelectric modules, shown in dashed form at 14 and 16, are positioned between burner unit 12 and case 10 so as to be in direct thermal contact with burner unit 12. Since dimensions of various mounting structures, etc. may vary relative to one another in response to the relatively high temperatures achieved in proximity to burner unit 12, it is preferable that burner unit 12 be held in place by means of a spring relief mounting, details of which are not shown, which permits variations in appropriate dimensions without any significant change in spring forces. This sort of design prevents buildup of excessive compressive stresses on the thermoelectric modules 14 and 16. Modules 14 and 16 are of conventional design, and as is well known to those skilled in the art generate electrical energy in response to a temperature gradient across the modules.

Thermoelectric modules as used in the illustrated embodiment are widely commercially available, and generally comprise a plurality of thermoelectric elements sandwiched between two insulating plates made of, for example, a ceramic material. One commercially available module particularly suitable for use with the present invention is the type 2004 module manufactured by the Cambion Corporation of Cambridge, Mass. In addition, although two modules are shown in the illustrated embodiment, it should be understood that any number of modules could be used, and that individual thermoelectric elements with appropriate associated insulation could also be employed.

The modules 14 and 16 are preferably connected in series, the output of both modules being coupled into a compartment 20 in a manner not shown. Compartment 20 contains various circuitry for amplifying the signal from the thermoelectric modules. Typically, this circuitry comprises a DC-DC voltage conversion circuit to accept power from the thermoelectric modules at a low voltage and produce an output at a higher voltage. This higher voltage output is usually delivered as a charging current to batteries.

The apparatus in FIG. 1 also includes an air intake 22 and a hose or conduit 24 for passing air therethrough to burner unit 12. A fuel line connector 26 is connected to a supply of fuel, which may take the form of a suitable combustible gas such as methane, propane, butane, natural gas, etc. stored under pressure. Fuel gas is passed through various fittings, the pressure of the fuel gas being adjustable by means of a pressure regulator 28. The temperature achieved by burner unit 12 can be regulated by means of adjustment of pressure regulator 28. The fuel gas flows through a section of restrictive tubing, shown schematically at 30, and into a series of fittings 32 which are connected to burner unit 12. The fuel gas is combusted within burner unit 12 in a manner which will be described below, thereby producing exhaust gases which are passed through hose or conduit 33 so as to exit the case at exhaust outlet 34. The entire apparatus shown in FIG. 1 is preferably oriented such that exhaust gases from exhaust outlet 34 flow in a generally downward direction. One benefit derived from the downward flow of the exhaust is that the exhaust can be cooled well below the condensation temperature of water at the point of release, without collecting water within the apparatus. An additional preferred feature shown in FIG. 1 is a polycarbonate heat shield 36, which is shown as broken away, mounted to case 10 so as to enclose burner unit 12. Shield 36 operates at a sufficiently low temperature that it can be safely touched when the thermoelectric generator is operating. In addition to its function as a hand guard, the shield 36 reduces convective heat loss from the thermoelectric generator to the interior of case 10, increasing the power of the generator and reducing the temperature of other components.

Referring now to FIG. 2, there is shown a cross sectional view of burner unit 12. Burner unit 12 includes a shell member 38 having various passages therein which are hereinafter described and an interior surface 40 which defines a cavity. Aluminum is the presently preferred shell member material due to its high thermal conductivity, lightness in weight, and compatibility with many types of fuel gases. Other thermally conductive metals or plastics could be employed, however. Shell member 38 has a fuel inlet passage 42 within which one received the various fittings denoted generally at 32. As discussed above, tubing shown in FIG. 1 is connected to fittings 32, an appropriate fuel being supplied to inlet passage 42 accordingly. A nozzle 44 is positioned within inlet 42 for receiving fuel therethrough. Preferably, an O-ring seal 46 is provided between the interior surface of a reduced diameter end of inlet 42 and nozzle 44 in order to provide an adequate seal. A spring 48 is disposed within inlet 42 in the illustrated embodiment such that one end of the spring abuts a fitting, whereas the other end abuts nozzle 44. Therefore, a force is exerted against nozzle 44 and thus also against O-ring 46 so as to enhance the sealing effect. Nozzle 44 has an outlet orifice 49 which empties into a venturi passage 50 in shell member 38. As shown, orifice 49 is generally aligned with the longitudinal axis of venturi passage 50, and is spaced from the upstream end of venturi 50. Venturi 50 converges from its upstream end to a throat 52, and diverges from throat 52 to its downstream end. An inlet passage 54 for oxidant gas is provided in shell 38 such that one end is connected to the upstream end of venturi 50. The downstream end of venturi passage 50 is connected to another passage 56 within shell 38.

A cartridge member shown generally at 58 is generally coaxially disposed within the cavity defined by interior surface 40 of shell 38. Cartridge member 58 is preferably made of stainless steel, but other materials capable of withstanding high temperatures approaching 1,000° F. could also be utilized. The material used for cartridge member 58 should also be relatively corrosion resistant, and be compatible with exhaust fumes generated within the cartridge member. It is also preferable that the material used be a poor conductor of heat, the reason for which will become more apparent below. Cartridge 58 has an axis, a first end 59a and a second end 59b, and can be regarded as comprising a first portion 60 and a second portion 62. Portion 60 axially extends from end 59a to portion 62, whereas portion 62 axially extends from portion 60 to end 59b. Cartridge 58 also includes a radially extending generally annular flange 64 at end 59a. Flange 64 is preferably in contact with interior surface 40 around the circumference of the flange. Cartridge portion 62 includes a generally annular flange 66 which is also in contact with interior surface 40 around the circumference of the flange. Preferably, the contact between interior surface 40 of shell 38 and flanges 64 and 66 as described above are the sole points of contact between cartridge 58 and shell 38. Thus, a generally annular space 68 is defined between the exterior surface of cartridge 58 and the interior surface of shell 38. This space extends around the circumference of cartridge portion 60, and along substantially the entire length of cartridge portion 60.

Cartridge portion 60 is hollow as shown, and has an interior surface 70. Two screens, preferably made of stainless steel, are mounted within cartridge portion 60 so as to be axially spaced from one another. Screen 71 and 72 may be perforated plates or of any other similar structure which will be gas permeable. Interior surface 70 and also screen 71 and 72 define a combustion chamber 74 which contains a loose bed of catalyst pellets shown schematically at 76. The presently preferred catalyst is a platinum/sodium catalyst supported on an alumina substrate. Other catalysts, such as palladium catalysts, could also be employed as long as they are suitable for the catalytic oxidation of a fuel. For the purpose of initiating the combustion reaction, a suitable ignition device such as a DC cartridge heater 78 is inserted into the center of the catalyst bed.

Cartridge portion 62 includes an interior surface which defines a generally frustoconical passage 80. Cartridge portion 62 also has a plurality of passages 82, only two of which are shown in the cross sectional view of FIG. 2. One end of each passage is connected to the small end of frustoconical passage 80 so as to be in fluid communication with chamber 74. The other end of each passage 82 is in fluid communication with points beyond the burner unit 12. Additionally, flange 66 and the interior surface of shell 38 are threaded as shown so that cartridge 58 can be easily removed for maintenance, replacement of catalyst, etc. Finally in connection with FIG. 2, several holes such as shown at 84 are provided in shell 38 for receiving mounting posts therethrough.

Referring now to FIG. 3, an end view of burner unit 12 shows passages 82 and cartridge portion 62. The mounting arrangement of one thermoelectric module 16 is also illustrated. The thermoelectric module used in the illustrated embodiment comprises two insulating plates 86 and 88 between which are sandwiched a plurality of thermoelectric elements such as shown schematically at 90. Plate 86 is in direct contact with the exterior surface of shell 38, and plate 88 is in direct contact with case 10. Plate 86 forms the hot side of module 16, whereas plate 88 forms the cold side. Thermoelectric elements 90 are in direct thermal contact with the exterior surface of shell 38 such that substantially no air spaces exist between the exterior surface of shell 38 and the thermoelectric elements. Although case 10 is conveniently used in the illustrated embodiment as a heat sink, it should be understood that any other suitable heat sink could be employed such as heat dissipating fins, for example. Most preferably, a thermally conductive plastic or a conductive grease such as silicon grease loaded with thermally conductive particles is interposed between each of plates 86 and 88 and its respective surface which it contacts.

The apparatus shown in FIGS. 2 and 3 operates as follows. A suitable fuel gas such as propane, butane, natural gas, etc. is passed into inlet 42. The gas then flows through nozzle 44 so as to exit the nozzle from orifice 49. The apparatus uses the jet pump principle to ingest air through inlet 54, wherein momentum is transferred from the gas jet to air which has entered inlet 54. The air flow rate is determined by the rate that momentum is imparted to the air/fuel mixture by the gas jet leaving the orifice. The rate of momentum transfer is identical to the recoil thrust produced by a gas jet. It can be shown that to a good approximation, the rate of momentum transfer, and thus the air flow rate, is constant for all fuel gas compositions.

Fuel gas and air ingested as described above mix together to form a mixture which is pumped through venturi passage 50 and then through passage 56 so as to be introduced to combustion chamber 74. Preferably the mixture introduced to combustion zone 74 is very fuel rich. Most preferably, the air/fuel volume flow ratio is less than the stoichiometric ratio for methane, which is about 9.54. As used herein, the stoichiometric ratio for a particular fuel gas is that air/fuel ratio at which there is theoretically sufficient oxygen to completely consume the fuel gas. Fuels of higher heating value than methane require a greater volume of air than required by methane for complete combustion of a particular volume of fuel. Since methane is about the lowest heating value fuel, employing other fuels having a higher heating value will produce approximately the same quantity of heat as methane if combustion is air-limited as described above. Therefore, combustion is constrained by the air available, and the power produced and temperatures achieved are not a strong function of the composition of the fuel gas. By providing an air/fuel ratio below the stoichiometric ratio for methane one may conveniently change from one fuel gas to another fuel gas while maintaining a relatively constant power output without making any adjustments in the apparatus. One disadvantage is that such a highly fuel rich mixture causes a large fraction of the fuel to be left unburned, and thus a loss of combustion efficiency. However, the cost of fuel is not an important consideration due to the very low flow rate device shown in FIGS. 2 and 3. Some other advantages of the fuel rich mixture include a greater driving pressure through the catalyst bed than would be achieved with a greater volume of air, and easier ignition than in the case where more air is present.

The fuel rich mixture as described above is achieved by carefully setting certain parameters. Such parameters which effect the air/fuel ratio include size of the nozzle outlet orifice 49, gas pressure at the orifice, size of the venturi passage 50, particularly in the throat portion 52 and back pressure resulting from the catalyst bed. Probably the most important parameter is the size of venturi passage 50. By changing the size of the venturi passage, the air flow rate can be changed, whereas the fuel gas flow rate remains unchanged. The size of venturi passage 50 establishes the area available for the expanding jet of gas to mix with the air. Generally speaking, as the size of venturi passage 50 is decreased, the flow rate of air ingested by the jet principle as previously described is also decreased.

The combustible mixture passes through screen 71 and into combustion chamber 74 which contains catalyst pellets. Ignitor 78 is activated for a predetermined period of time, usually several minutes, to initiate the combustion reaction. Flameless catalytic oxidation of the fuel gas takes place within combustion chamber 74 accordingly, thereby generating heat. Typically, temperatures from about 800° F. to about 1000° F. are achieved within the combustion chamber. Combustion product gases pass from combustion chamber 74 through frustoconical passage 80, and through passages 82 so as to be exhausted from burner unit 12. Sufaces which define passages 82 serve as a heat exchange surface area within the cartridge. Heat is effectively scavenged from the exhaust gases in this heat exchange area. This enhances the ability of the burner unit to operate over a broad temperature range as at high ambient temperatures the exhaust gases pass through the heat exchange area at too high a temperature for condensation of the water produced by combustion. This reduces the power produced within the burner. At low ambient temperatures, however, the moisture is condensed within this region and a greater fraction of the heat of combustion is delivered to the burner. Heat generated within the combustion chamber is transferred from cartridge member 58 to shell member 38 by convective and radiant heat exchange across space 68. Heat is also transferred to shell member 38 at the point of contact between flanges 64 and 66 with the interior surface of shell 38. Heat transferred as described above is received by the hot sides of the thermoelectric modules in contact with the exterior surface of shell member 38. Case 10, which serves as a heat sink, maintains the cold sides of the modules at a relatively low temperature, thus establishing the required temperature difference across the modules. This temperature difference or gradient causes the termoelectric elements in each module to generate electrical energy.

As discussed above, problems can potentially arise where a fuel gas is used which has a high concentration of hydrogen sulfide. If the temperature within the combustion chamber is maintained at too low a level the hydrogen sulfide within the fuel gas will break down to elemental sulfur and coat the catalyst pellets within the chamber. Such coating of the pellets can render the catalyst inactive. The mounting arrangement of cartridge member 58 within shell 38 provides a significant degree of thermal resistance between combustion chamber 74 and shell 38. Therefore, the temperature within combustion chamber 74 can be maintained at a much higher temperature than the exterior surface of shell 38 (which also corresponds to the temperature of the hot side of the thermoelectric modules). Low cost thermoelectric modules such as those used in the illustrated embodiment typically have a maximum operating temperature of about 300° F., above which various solder connections in the module will start to melt. In a burner unit constructed according to the present invention, the hot sides of the thermoelectric sides of the modules can be maintained below their maximum operating temperatures, while at the same time the temperature within the combustion chamber can be maintained at a relatively high level of about 800° F. to about 1000° F. At such combustion chamber temperatures, oxidation of sulfur in hydrogen sulfide produces such products as $SO_2$ and $H_2SO_4$ which pass out of the burner unit with other exhaust gases. Thus, substantially no element sulfur is produced when the combustion chamber operates at the above cited temperatures, such that plating of the catalyst is thereby avoided.

Certain other additional advantages reside in the apparatus of the present invention. One additional advantage is that the burner temperature is self regulated to a great extent. This is due to the enbloc construction of the nozzle and venturi into the same body, the shell, which receives heat from the combustion chamber. Generally speaking, the rate that momentum is delivered to the air/fuel mixture will decrease with increasing temperature. Thus, as the shell 38 increases in temperature, venturi 50 and nozzle 44 increase in temperature. Because of the decreased momentum delivered to the air/fuel mixture, the amount of gas and air pumped into the combustion chamber is reduced, and the operating temperature of the combustion chamber is also reduced. Thus, this construction provides for a degree of self regulation of the burner temperature. In addition, certain features of the thermoelectric generator described above allow its application without posing an ignition hazard for combustible gas vapors. For example, temperatures are maintained well below 390° F. on exposed surfaces. These temperatures are well below the ignition temperatures of most vapors which might come into contact with such hot exposed surfaces. The ignition hazard is also minimized due to the oxygen depleted nature of exhaust gases. The exhaust gases are typically far too depleted to support combustion. Even when the exhaust gases are mixed with air, ignition of the exhaust gases is precluded by the cooling effect of the heat exchange area in the cartridge. The exhaust gases are cooled in the heat exchange area well below their ignition temperature. Ignition of the air/fuel mixture before reaching the combustion chamber is also unlikely due to the fact that the temperature of all metal surfaces in passages leading to the combustion chamber remain below the ignition temperature of the air/fuel mixture. Ignition of combustible vapors due to flash back is also precluded by the very rich mixture employed.

A concrete example will now be described which should not be construed to limit the invention in any manner. A thermoelectric generator substantially similar to that shown in FIGS. 1–3 was constructed and tested. The cartridge was constructed of stainless steel, and the shell was constructed of aluminum. The catalyst employed was 0.5% platinum with 0.4% sodium on $\frac{1}{8}$ inch diameter by $\frac{1}{8}$ inch long tablets. A 36 gram charge of the catalyst tablets was supported within the cartridge. A 12 volt, 5 amp DC cartridge heater was utilized to initiate the combustion reaction. Certain important dimensions include a venturi throat diameter of 0.141 inch, and a nozzle orifice diameter of 0.010 inch. With respect to certain operating conditions, the pressure at the orifice was set at 1 psig and the flow rates for fuel gas and air were about 0.72 scfh and about 4.6 scfh respectively, giving an air/fuel ratio of about 6.4.

Figure 4:
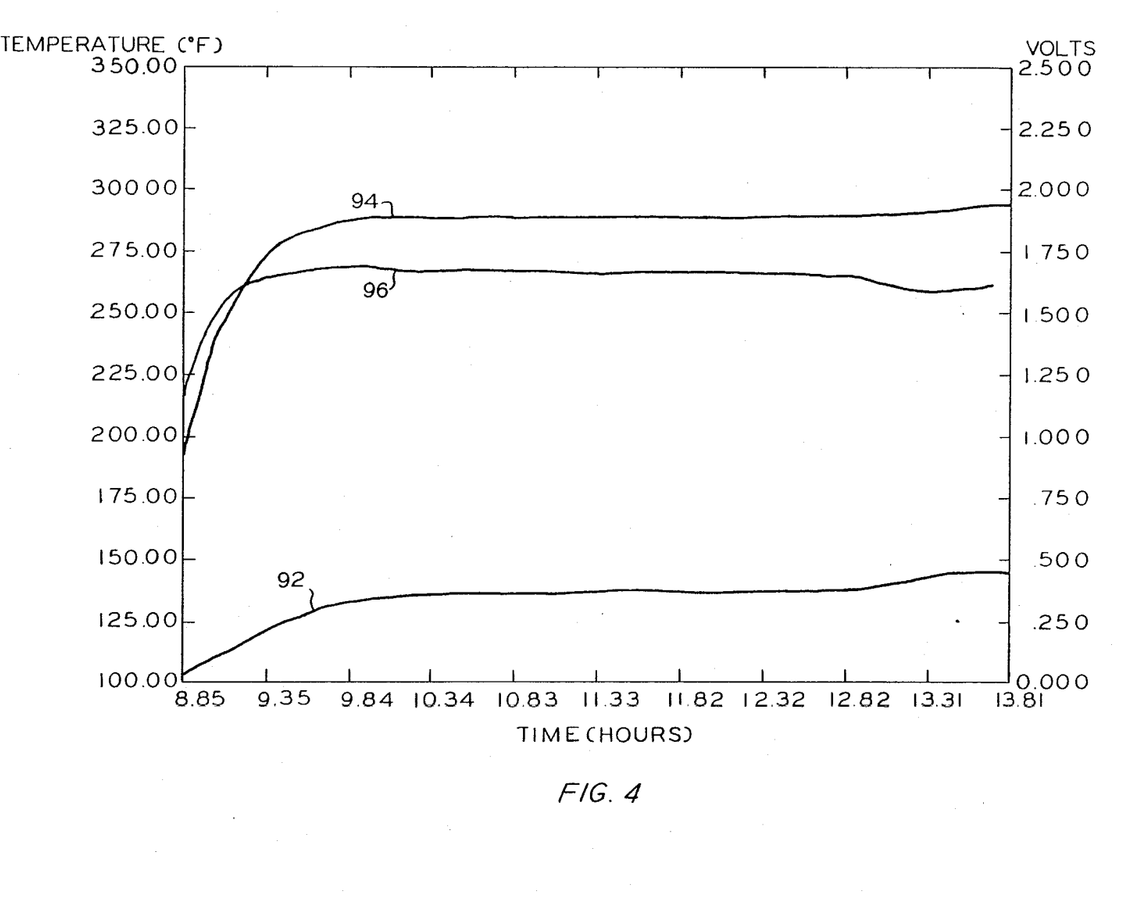
FIG. 4 is a graphical plot of various parameter versus time according to a particular example wherein methane was employed in a thermoelectric generator designed according to the invention.

The apparatus described above was first operated using methane as the fuel gas. The apparatus was operated in a temperature chamber in an ambient temperature of 130° F. for about 3 hours. Referring to FIG. 4, curve 92 is a plot of ambient temperature versus time, wherein the time scale begins at 8.85 hours. The curve 94 is a plot of the burner unit temperature at a point on the shell near the thermoelectric modules. It can be seen from this curve that the thermoelectric modules remain well below 300° F., which is their approximate maximum operating temperature. The output in volts of the thermoelectric generator is plotted versus time, the curve so obtained being shown at 96. A relatively constant electrical power output in excess of 1 watt is reliably obtained.

Figure 5:
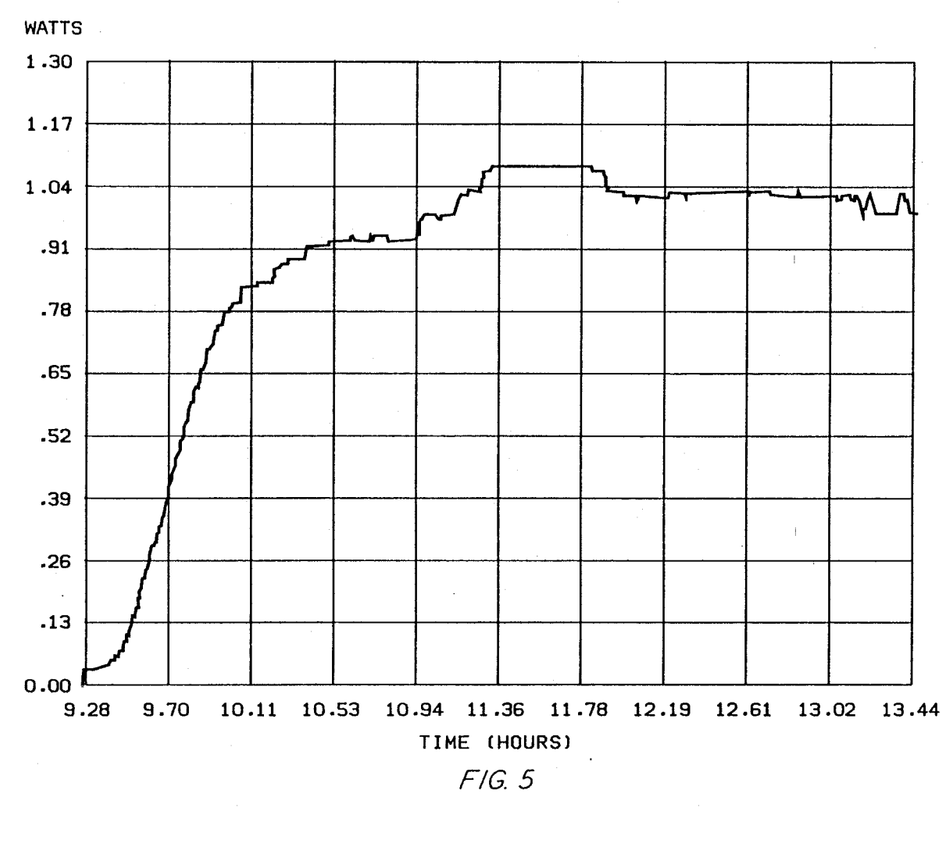
FIG. 5 is a graph of output in watts versus time for a thermoelectric generator designed according to the invention employing fuel with a high concentration of hydrogen sulfide.

The thermoelectric generator constructed according to the present example was also tested using sour gas containing hydrogen sulfide ($H_2S$). Referring to FIG. 5, power output is plotted versus time for the generator starting up on a mixture of 9.9% $H_2S$ in methane. Subsequent field testing demonstrated the ability of the generator to start and run for a month on a gas containing about 20% H₂S. At the end of about a month, there was some clogging of the exhaust hose due to sulfur deposits. After cleaning of the exhaust hose, the generator was restarted and operated with a normal power output. The generator was also operated for three months on gas containing about 8% H₂S. At the end of the three months, the generator still operated normally, indicating no apparent degradation of the catalyst.

Figure 6:
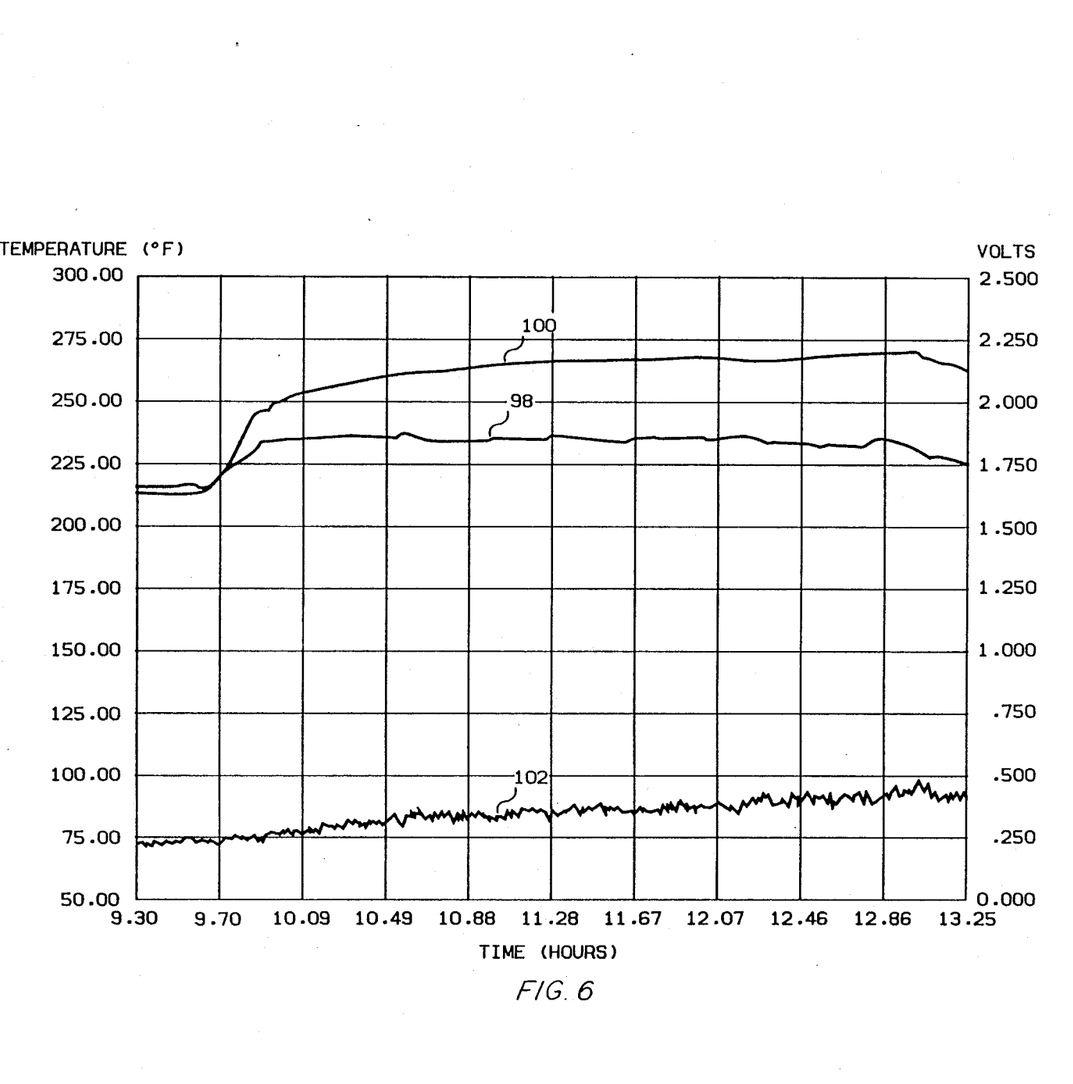
FIG. 6 is a graph of various parameters versus time for a thermoelectric generator designed according to the invention initially running on methane, wherein propane is introduced in gradually increasing amounts.

The ability of the generator to operate on a wide variety of fuels was investigated by operating on methane, methane blended with nitrogen to obtain lower BTU values, methane blended with propane to obtain higher BTU values, and even on pure propane. The lowest heating value on which the generator would operate was about 700 BTU/CF. At the other end of the scale, it was found that as the heat value rose past 1400 BTU/CF, the power output ceased to increase with heat value. Referring to FIG. 6, the curve shown at 98 illustrates the ouput initially running on methane, propane being introduced for a step change from about 1000 BTU/CF to more than 2500 BTU/CF, with an apparent power increase of only about 25%. This confirms that the power is more constrained by the air available than by the fuel heat value. Also in FIG. 5, curve 100 is a plot of shell temperature (near the modules) versus time, and the curve shown at 102 is a plot of ambient temperature versus time.

Obviously many modifications and variations of the present invention are possible in light of the above teachings. It is therefore to be understood that within the scope of the appended claims the invention may be practiced otherwise than as specifically described.

What is claimed is:

1. A thermoelectric generator apparatus comprising:
   a hollow shell member having an interior surface and an exterior surface, said interior surface defining a cavity;
   a hollow cartridge member disposed within said cavity, at least a portion of said cartridge member having an interior surface which defines a combustion chamber, said cartridge member also having an exterior surface and first and second radially extending generally annular flanges, each flange being in contact with said shell member interior surface around at least a portion of its circumference so as to define a generally annular space between said flanges and between said shell member interior surface and said cartridge member exterior surface;
   a means for introducing a mixture of fuel and oxidant gas into said combustion chamber;
   at least one thermoelectric element in direct thermal contact with the exterior surface of said shell member such that substantially no air spaces exist between said shall member exterior surface and said at least one thermoelectric element, said at least one thermoelectric element being adapted for generating electrical energy when receiving heat from said shell member.

2. An apparatus as recited in claim 1, wherein said space between said flanges extends around the circumference of said cartridge member portion.

3. An apparatus as recited in claim 2, wherein said space between said flanges extends along substantially the entire length of said cartridge member portion 4. An apparatus as recited in claim 3, wherein said cartridge member portion defining said chamber is denoted as a first cartridge member portion, and wherein said cartridge member includes a second portion, said second portion having at least one passage having a first end and a second end, said passage first end being in fluid communication with said chamber and said passage second end being in fluid communication with points beyond the apparatus.

5. An apparatus as recited in claim 4, wherein said cartridge member has an axis, a first end and a second end, said first portion axially extending from said cartridge member first end to said second portion and said second portion axially extending from said first portion to said cartridge member second end, and wherein said first flange extends from said cartridge member first end and said second flange extends from said cartridge member second end, and wherein points of contact between said flanges and said shell member interior surface are the sole points of contact between said cartridge member and said shell member.

6. An apparatus as recited in claim 5 wherein there are a plurality of passages through said cartridge member second portion.

7. An apparatus as recited in claim 1, wherein said chamber contains a catalyst for promoting the catalytic oxidation of the fuel.

8. A method of thermoelectric power generation comprising:
   positioning a hollow cartridge member, having an interior surface and an exterior surface, within a hollow shell member also having an interior surface and an exterior surface, said hollow cartridge member having first and second generally annular radially extending flanges and also having a chamber defined by the interior surface of at least a portion of said cartridge member wherein said cartridge member is positioned so that each flange contacts said shell member interior surface around at least a portion of its circumference so as to define a generally annular space between said flanges and between said shell member interior surface and said cartridge member exterior surface;
   generating heat within said chamber;
   providing heat generated in said chamber to at least one thermoelectric element in direct thermal contact with the exterior surface of said shell member such that substantially no air spaces exist between said shell member exterior surface and said at least one thermoelectric element.

9. A method as recited in claim 8 wherein said heat generating step includes: introducing a mixture of a combustible fuel and an oxidant gas into said chamber; and combusting said mixture.

10. A method as recited in claim 9, wherein the oxidant gas is air, and the air/fuel ratio of the mixture is less than the stoichiometric ratio for methane.

11. An apparatus comprising:
   a hollow shell member having an interior surface and an exterior surface;
   a hollow cartridge member generally coaxially disposed within said shell member, said cartridge member having an exterior surface, an interior surface of which at least a portion defines a combustion chamber within said cartridge member, and at least one radially extending flange which contacts the interior surface of said shell member around at least a portion of the circumference of said at least one flange so that a space is defined by said flange and between said shell member interior surface and said cartridge member exterior surface, said space extending substantially around the circumference of said cartridge member;

a means for introducing a combustible mixture into said combustion chamber;

a means for igniting combustible mixture introduced to said combustion chamber so as to initiate combustion of said mixture to thereby generate heat;

at least one thermoelectric element in direct thermal contact with the exterior surface of said shell member, said thermoelectric element being adapted for generating electrical energy upon receiving heat from said shell member.

12. An apparatus as recited in claim 11, wherein points of contact between said at least one flange and said shell member interior surface are the sole points of contact between said cartridge member and said shell member.

13. An apparatus as recited in claim 12, wherein said cartridge member has a first portion, a second portion, a first open end and a second open end, the interior surface of said first portion defining said combustion chamber, wherein said first portion axially extends from said first end to said second portion and wherein said second portion axially extends from said first portion to said second end, said second portion having at leat one exhaust passage therethrough which communicates with said combustion chamber.

14. An apparatus as recited in claim 13, wherein said combustion chamber contains a bed of catalyst particles.

15. An apparatus as recited in claim 14, wherein said combustible mixture introducing means is adapted to introduce said mixture into said first open end for combustion of said mixture in said chamber and exhaust of gases through said at least one exhaust passage.

16. An apparatus as recited in claim 15, wherein at least a portion of said cartridge member interior surface defines a generally frustoconical passage positioned between and so as to communicate with said combustion chamber and said at least one exhaust passage.

17. An apparatus as recited in claim 16, wherein said combustible mixture introducing means includes: a fuel gas inlet passage formed within said shell member; a nozzle, having an orifice, positioned within said inlet passage for receiving fuel gas therethrough; a venturi passage formed within said shell member and having a longitudinal axis which is generally aligned with said nozzle orifice, said venturi passage being in communication with said combustion chamber and said fuel gas inlet passage; and an oxidant gas passage formed within said shell member and having one end connected to said venturi passage.

18. A method of thermoelectric power generation comprising:

positioning a hollow cartridge member generally coaxially within a hollow shell member, said cartridge member having a combustion chamber therein and at least one radially extending flange, said cartridge member being positioned so that said at least one flange contacts, around at least a portion of its circumference, the interior surface of said shell member so as to define a space between the exterior surface of said cartridge member and the interior surface of said shell member, the space extending around the circumference of said cartridge member;

combusting a combustible mixture in said combustion chamber to thereby generate heat;

providing said heat to at least one thermoelectric element in direct thermal contact with the exterior surface of said shell member, said element generating electrical energy.

* * * * *